(12) United States Patent
Okamoto

(10) Patent No.: US 7,041,896 B2
(45) Date of Patent: May 9, 2006

(54) HOUSING FOR ELECTRONIC APPARATUS

(75) Inventor: Shinya Okamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 10/290,237

(22) Filed: Nov. 8, 2002

(65) Prior Publication Data

US 2003/0090874 A1    May 15, 2003

(30) Foreign Application Priority Data

Nov. 12, 2001   (JP) ............................. 2001-346608

(51) Int. Cl.
*H02G 3/04*   (2006.01)
(52) U.S. Cl. .................. 174/48; 174/50; 174/135; 174/58; 257/906; 439/535
(58) Field of Classification Search ............... 174/48, 174/52.6, 135, 53, 58, 50, 52; 220/4.02, 220/3.8, 3.6; 248/906; 439/535
See application file for complete search history.

(56) References Cited

U.S. PATENT DOCUMENTS

| | | | |
|---|---|---|---|
| 4,759,466 A | | 7/1988 | Chase et al. |
| 4,916,578 A | | 4/1990 | Mast |
| 4,952,752 A | | 8/1990 | Roun |
| 5,594,207 A | * | 1/1997 | Fabian et al. .................. 174/58 |
| 5,777,854 A | | 7/1998 | Welch et al. |
| 6,147,304 A | * | 11/2000 | Doherty ........................ 174/48 |
| 6,194,653 B1 | | 2/2001 | McMiller et al. |
| 6,232,550 B1 | | 5/2001 | Mangold |

FOREIGN PATENT DOCUMENTS

DE            199 42 949        8/2001

* cited by examiner

*Primary Examiner*—Dhiru R. Patel
(74) *Attorney, Agent, or Firm*—McGinn IP Law Group, PLLC

(57) ABSTRACT

The invention provides a housing for an electronic apparatus whose components can be worked through a reduced number of steps without deteriorating the shielding performance against electromagnetic waves. The housing for an electronic apparatus includes a plurality of metal plates including a first metal plate and a second metal plate and each having a coated face coated over an overall area thereof and a non-coated face. The metal plates are assembled to form the housing such that the coated faces thereof are exposed as outer faces to the outside of the housing. The first metal plate is bent back at a portion thereof such that the non-coated face thereof is exposed to the outside to form a contact portion on a side edge of the first metal plate. The first metal plate is coupled to the second metal plate with the non-coated face of the contact portion thereof held in contact with the non-coated face of the second metal plate to establish electric connection between the first and second metal plates.

34 Claims, 9 Drawing Sheets

HOUSING FOR ELECTRONIC APPARATUS

BACKGROUND OF THE INVENTION

1. Field of the Invention

The present invention relates to a housing for an electronic apparatus such as a server of a work station, and more particularly to a housing having an electromagnetic wave leakage preventing function.

2. Description of the Related Art

It is sometimes demanded that a housing for an electronic apparatus have a function of preventing radiation to the outside of electromagnetic waves generated from electronic parts, electronic circuits and so forth accommodated in the housing. In order to satisfy the demand, it is a conventional countermeasure to establish electric connection at a fitting location between a plurality of metal plates which form a housing.

FIG. 3 is a perspective view showing part of a conventional housing, and FIG. 4 is an exploded view of the portion of the housing shown in FIG. 3. Referring to FIGS. 3 and 4, the conventional housing shown includes a bottom plate (not shown), a top plate 101 disposed in parallel to the bottom plate, and a pair of side plates 102 attached to the opposite edges of the bottom plate and the top plate 101. The bottom plate, top plate and side plates are all metal plates.

FIG. 5 is a perspective view showing an end portion of the top plate 101. A coupling edge portion 106 for coupling the top plate 101 to a side plate 102 is provided on a side edge of the top plate 101. The coupling edge portion 106 is formed as a unitary member including a vertical first portion 106a bent downwardly in an L-shape from the side edge of the top plate 101, a horizontal second portion 106b bent in an L-shape toward the inner side of the housing from the first portion 106a, and a vertical third portion 106c bent downwardly in an L-shape from the second portion 106b and extending in parallel to the first portion 106a. A plurality of horizontally elongated fitting slots 103 each tapering toward one end thereof are formed at different locations of an upper portion of the third portion 106c. Further, a plurality of contact portions 105 are formed together with recesses at portions of the third portion 106c below the fitting slots 103. An end portion of each of the contact portions 105 is bent to the outer side, and a circular projection 104 is provided on an outer face of an end portion of the bent portion. The outer face of the third portion 106c below a boundary between the fitting slots 103 and the contact portions 105 is formed as a non-coated face which is not coated, but the outer face of the third portion 106c above the boundary is colored by coating including the second portion 106b and the first portion 106a as well as the top face of the top plate 101. The coated portions are indicated by intersecting slanting lines.

Meanwhile, a horizontal coupling edge portion 102b bent in an L-shape is formed on the top edge of each side plate 102 as shown in FIG. 4, and a plurality of fitting pawls 102a are formed in an upwardly projecting manner at different locations of the coupling edge portion 102b. While the outer face of each of the side plates 102 is colored by coating including the outer face of the coupling edge portion 102b, the inner face of each of the side plates 102 is not coated including the inner face of the coupling edge portion 102b.

The top plate 101 and each side plate 102 are coupled to each other in the following manner. As shown in FIG. 4, the fitting pawls 102a of the side plate 102 are inserted into the fitting slots 103 of the top plate 101 and slidably moved to the tapering end side of the fitting slots 103 so that the fitting pawls 102a are fitted with the fitting slots 103 to couple the top plate 101 and the side plate 102 to each other. At this time, since the projections 104 project to the outer side farther than the base portion of the third portion 106c, they contact with the inner face of the side plate 102. Since the inner face of the side plate 102 is not coated, electric connection is established between the top plate 101 and the side plate 102.

It is to be noted that the opposite side edge portion of the top plate 101 and the other side plate 102 are joined together by a similar mechanism. Also the bottom plate and the side plates 102 are joined together by similar mechanisms.

Accordingly, radiation of electromagnetic waves from electronic parts, electronic circuits and so forth accommodated in the housing can be prevented by the entire housing.

FIGS. 6 and 7 show a top plate of another conventional housing. Referring to FIGS. 6 and 7, the top plate 110 of the conventional housing shown includes a metal plate 110a whose side edge portion 10b is bent downwardly in an L-shape. A conductive plate 110c having an L-shaped cross-section is secured by welding or the like to the inner side of the side edge portion 110b. A plurality of fitting slots 103 similar to those shown in FIG. 5 are formed at different locations of an upper portion of an exposed outer face of the side edge portion 110b. A plurality of contact portions 105 each having a projection 104 thereon are formed on the side edge portion 110b of the conductive plate 110c below the fitting slots 103. It is to be noted that, although the outer face of the metal plate 110a is colored by coating, the inner face of the metal plate 110a is not coated. The coated portions are indicated by intersecting slanting lines in FIG. 6. Further, the conductive plate 110c is not coated so that electric connection is established between the metal plate 110a and the conductive plate 110c.

Accordingly, also where the top plate 110 described is used, since the top plate 110 and a side plate are coupled to each other in a similar manner as in the conventional housing described hereinabove, radiation of electromagnetic waves from an electronic apparatus in the housing can be intercepted by the entire housing.

However, where the conventional top plate 101 shown in FIG. 5 is produced, if the contact portions 105 are coated, then since establishment of electric connection thereof to the side plates 102 becomes impossible, it is necessary to perform coating of a metal plate, which is to make the top plate 101, while the other portion than the intersecting slanting line portion in FIG. 5 is held masked. On the other hand, where the conventional top plate 110 shown in FIG. 6 is produced, it is necessary to secure the conductive plate 110c produced separately to the inner side of the metal plate 110a which is coated over the overall outer face thereof.

Accordingly, whichever one of the two top plates described above is used, the number of steps increases and the cost increases when compared with those in an alternative case wherein a top plate is produced only by shaping a coated steel plate produced by merely coating an overall outer face of a steel plate. Further, the top plate 110 shown in FIG. 6 has a problem also in that corrosion is liable to occur at joining portions thereof to the conductive plate 110c.

SUMMARY OF THE INVENTION

It is an object of the present invention to provide a housing for an electronic apparatus whose components can be worked through a reduced number of steps without deteriorating the shielding performance against electromagnetic waves.

In order to attain the object described above, according to the present invention, there is provided a housing for an electronic apparatus, comprising a plurality of metal plates including a first metal plate and a second metal plate and each having a coated face coated over an overall area thereof and a non-coated face, the metal plates being assembled to form the housing such that the coated faces thereof are exposed as outer faces to the outside of the housing, the first metal plate being bent back at a portion thereof such that the non-coated face thereof is exposed to the outside to form a contact portion on a side edge of the first metal plate, the first metal plate being coupled to the second metal plate with the non-coated face of the contact portion thereof held in contact with the non-coated face of the second metal plate to establish electric connection between the first and second metal plates.

In the housing, the contact portion is formed by partly bending back the first metal plate, whose one face is coated over an overall area thereof, such that the non-coated face thereof is exposed to the outside, and the first metal plate is coupled to the second metal plate with the non-coated face of the contact portion thereof held in contact with the non-coated face of the second metal plate to establish electric connection between the first and second metal plates. Consequently, even if a metal plate whose one face is coated over an overall area thereof is used for the first and second metal plates, electric connection between the metal plates is secured. Consequently, the housing can be produced with a reduced number of working steps and at a reduced cost when compared with the conventional housing.

Preferably, a projection for contacting with the non-coated face of the second metal plate is provided on the non-coated face of the contact portion of the first metal plate.

Preferably, an additional contact portion or portions similar to the contact portion are provided on the side edge of the first metal plate in such a manner as to contact at the non-coated face thereof with the non-coated face of the second metal plate. In this instance, preferably a projection for contacting with the non-coated face of the second metal plate is provided also on the non-coated face of the additional contact portion or portions of the first metal plate.

Preferably, a coupling edge portion is formed on the side edge of the first metal plate and bent so that the coated face thereof is directed to the outside, and has a projection formed thereon in such a manner as to be bent back in a U-shape to form the contact portion whose non-coated face is exposed to the outside. A slot may be formed in the coupling edge portion of the first metal plate while a pawl for fitting with the slot is formed on a side edge of the second metal plate. The coupling edge portion of the first metal plate may have a first portion bent in an L-shape on the side edge of the first metal plate, a second portion bent in an L-shape toward the inner side of the housing from the first portion, and a third portion bent in an L-shape from the second portion in such a manner as to extend in parallel to the first portion, and the projection on the third portion may be bent back in a U-shape to form the contact portion whose non-coated face is exposed to the outside. In this instance, a slot may be formed in the third portion of the coupling edge portion of the first metal plate while a pawl for fitting with the slot is formed on a side edge of the second metal plate.

The first and second metal plates may be coated steel plates. The first and second metal plates may form two walls of the housing which extend perpendicularly to each other.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
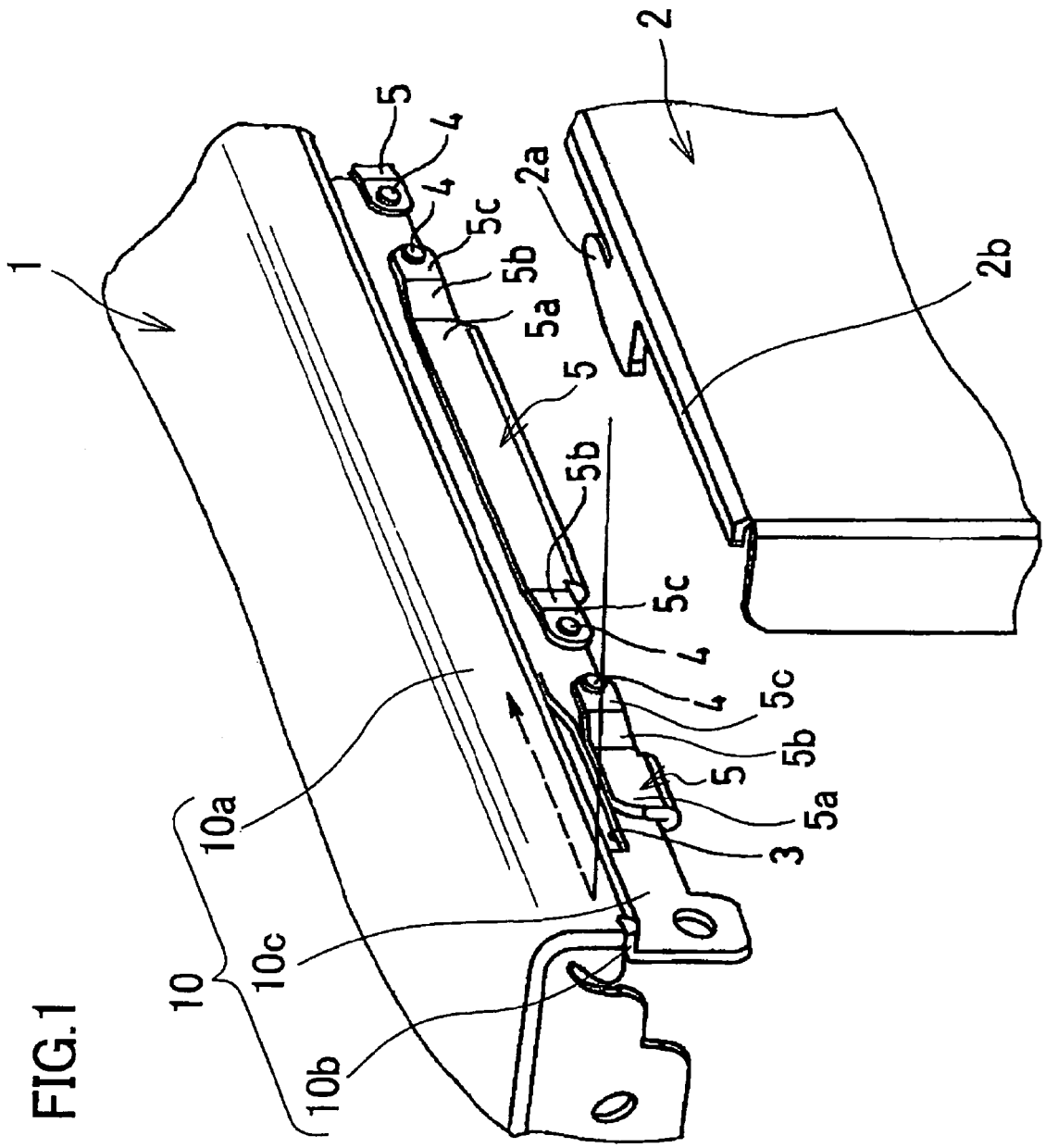
FIG. 1 is a perspective view showing a top plate and a side plate of a housing for an electronic apparatus to which the present invention is applied.
Figure 1A:
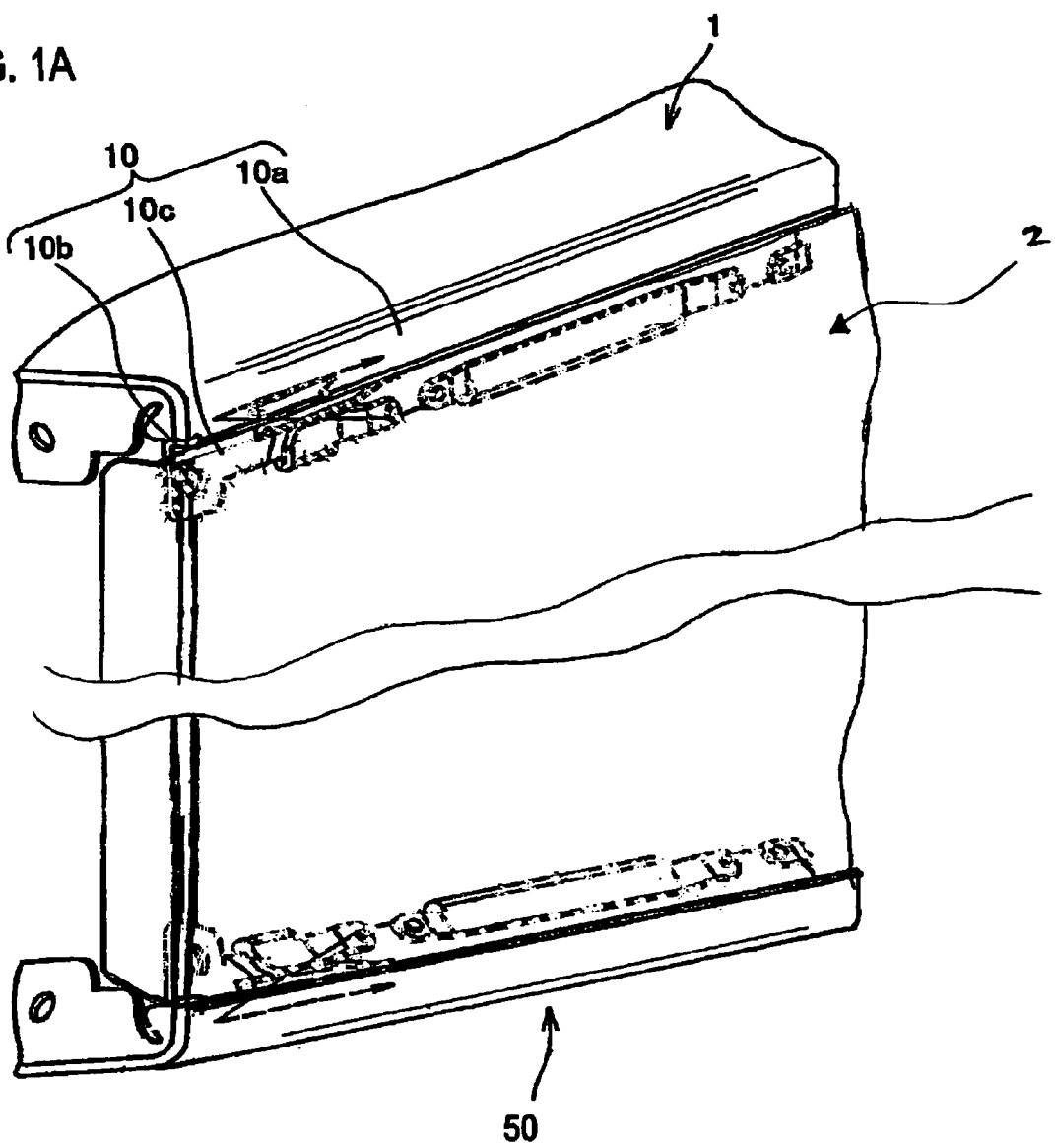
FIG. 1A is a perspective view showing the top and bottom plates connected to the side plate.
Figure 2:
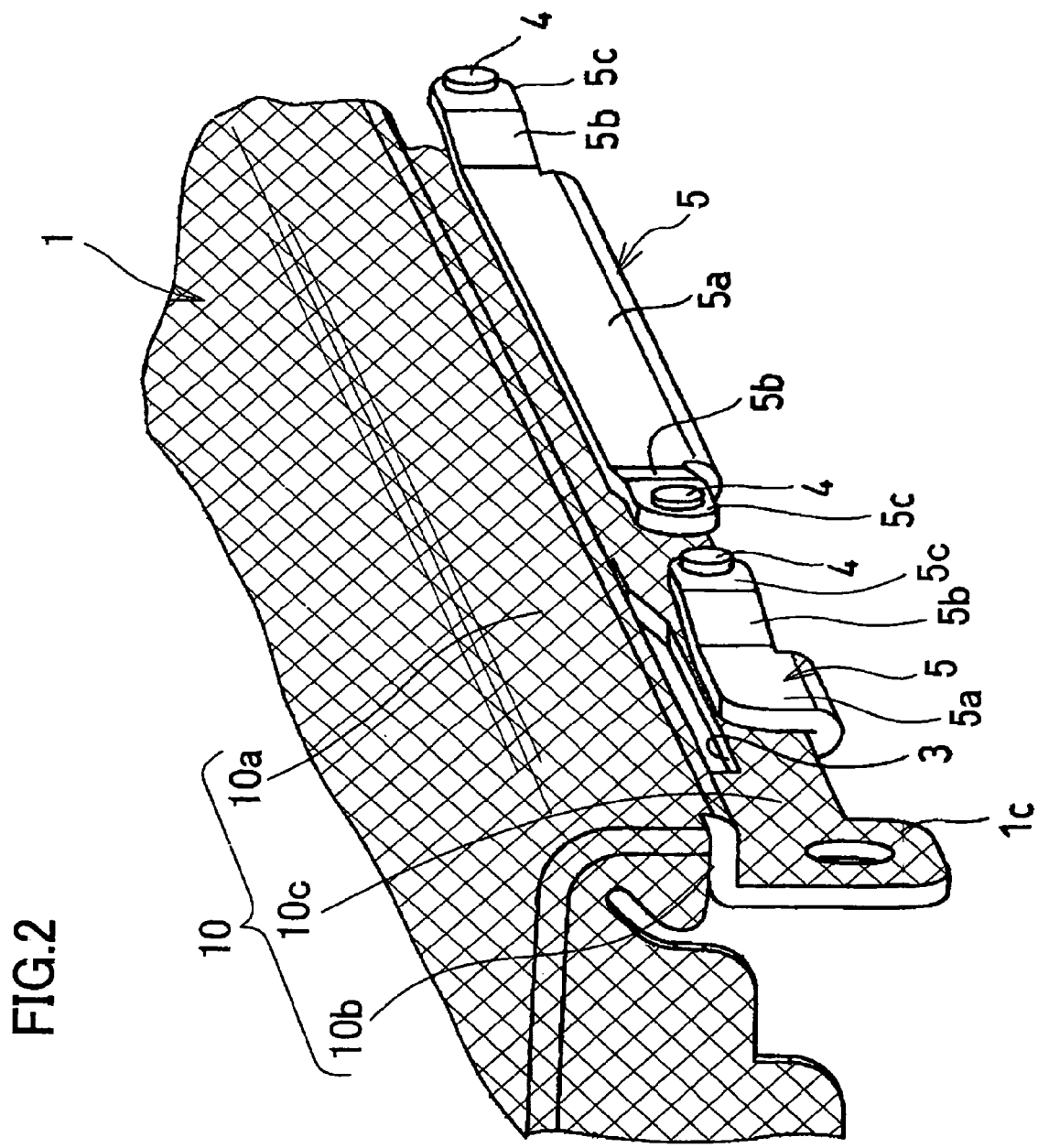
FIG. 2 is a perspective view showing an end portion of the top plate shown in FIG. 1.
Figure 2A:
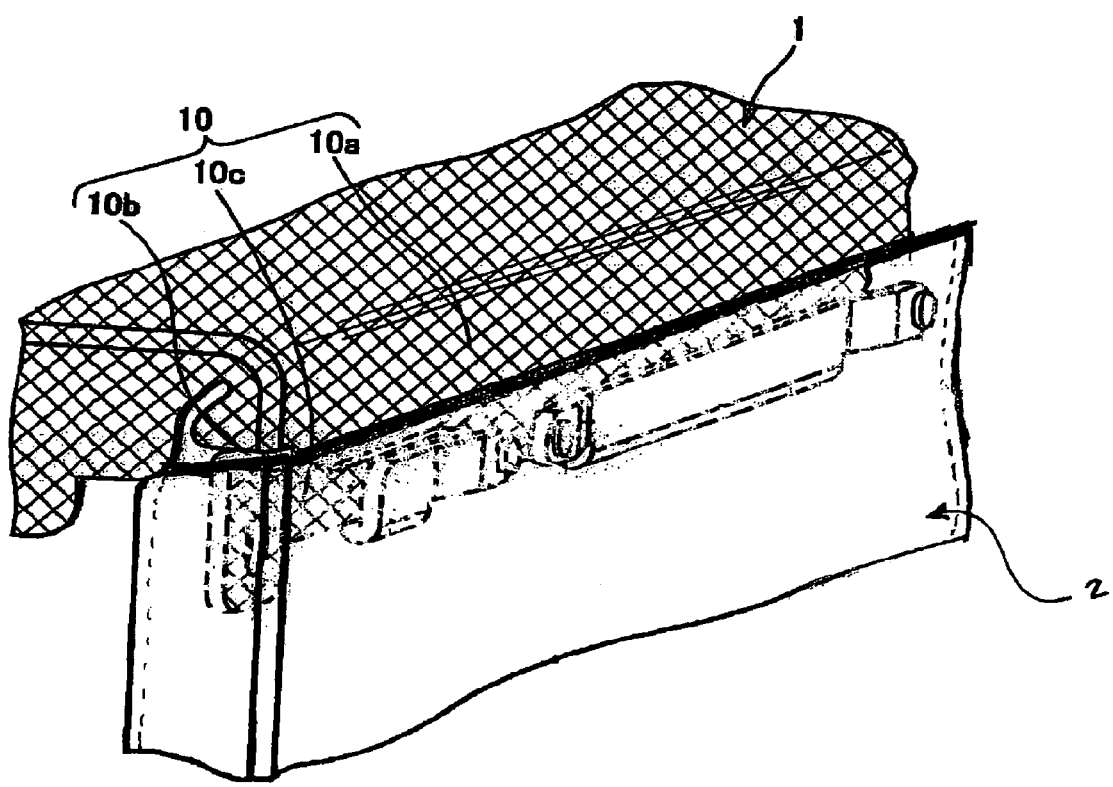
FIG. 2A is a perspective view showing the top plate connected to the side plate.
Figure 3:
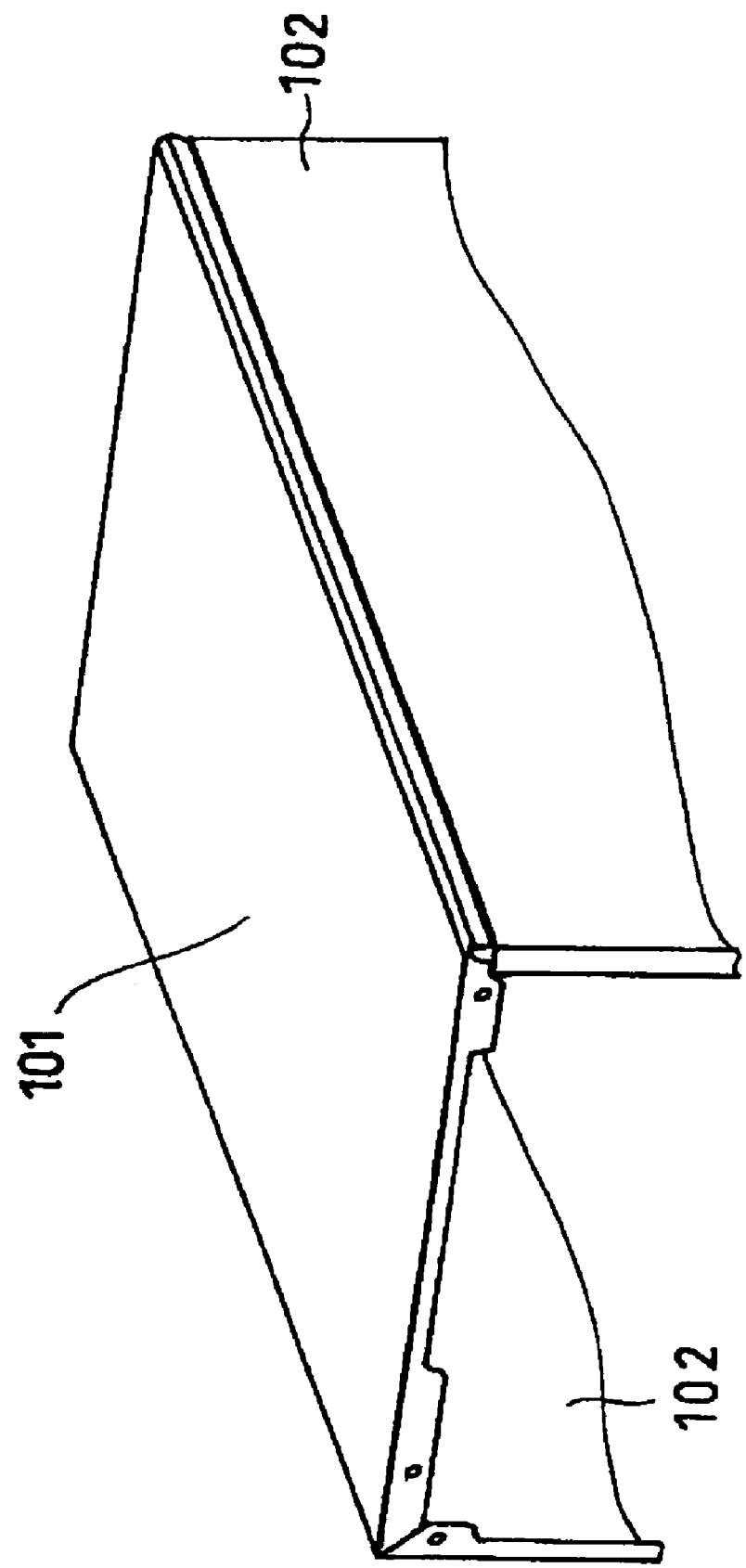
FIG. 3 is a perspective view showing part of a conventional housing.
Figure 4:
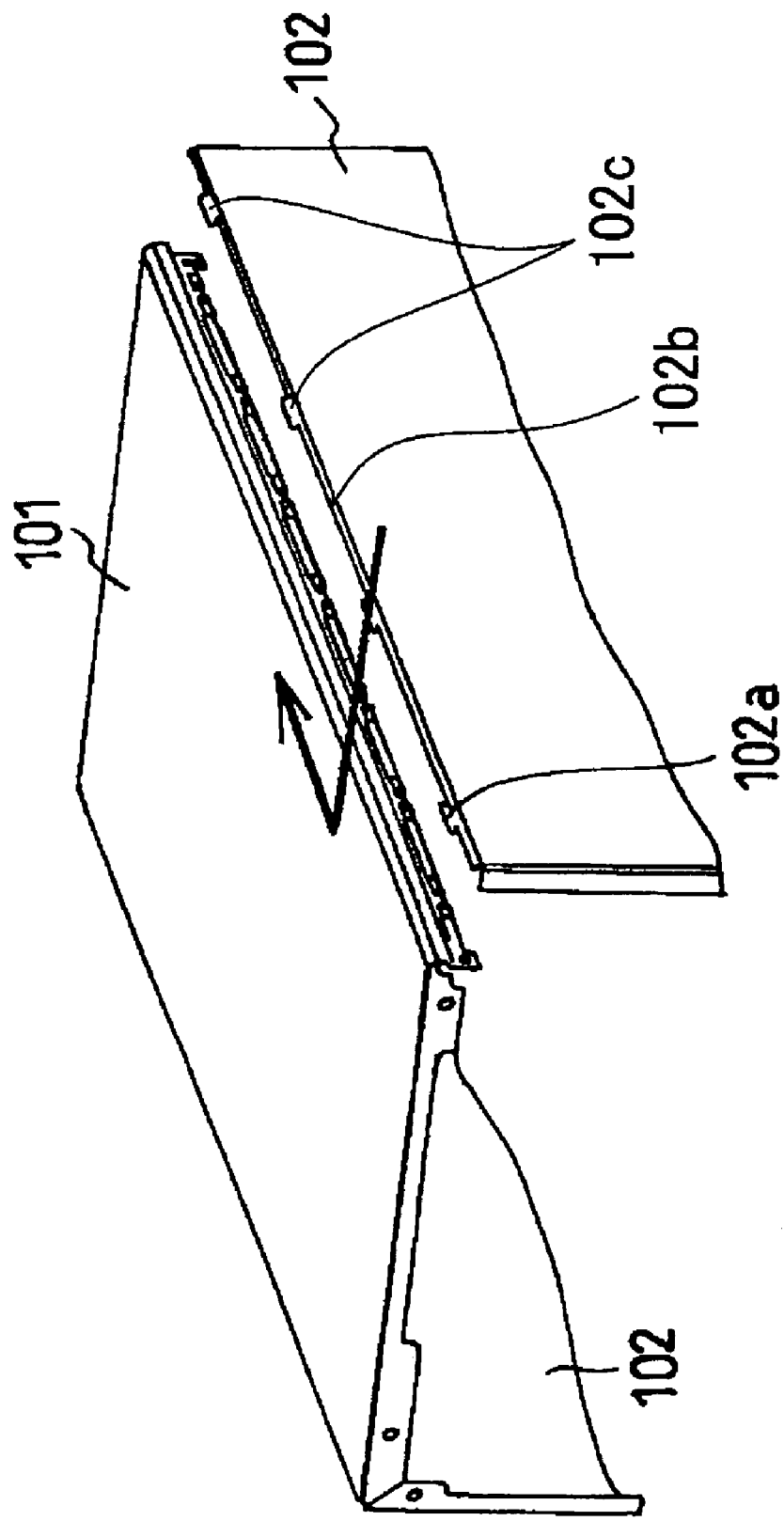
FIG. 4 is an exploded perspective view of a top plate and a side plate of the housing of FIG. 3.
Figure 5:
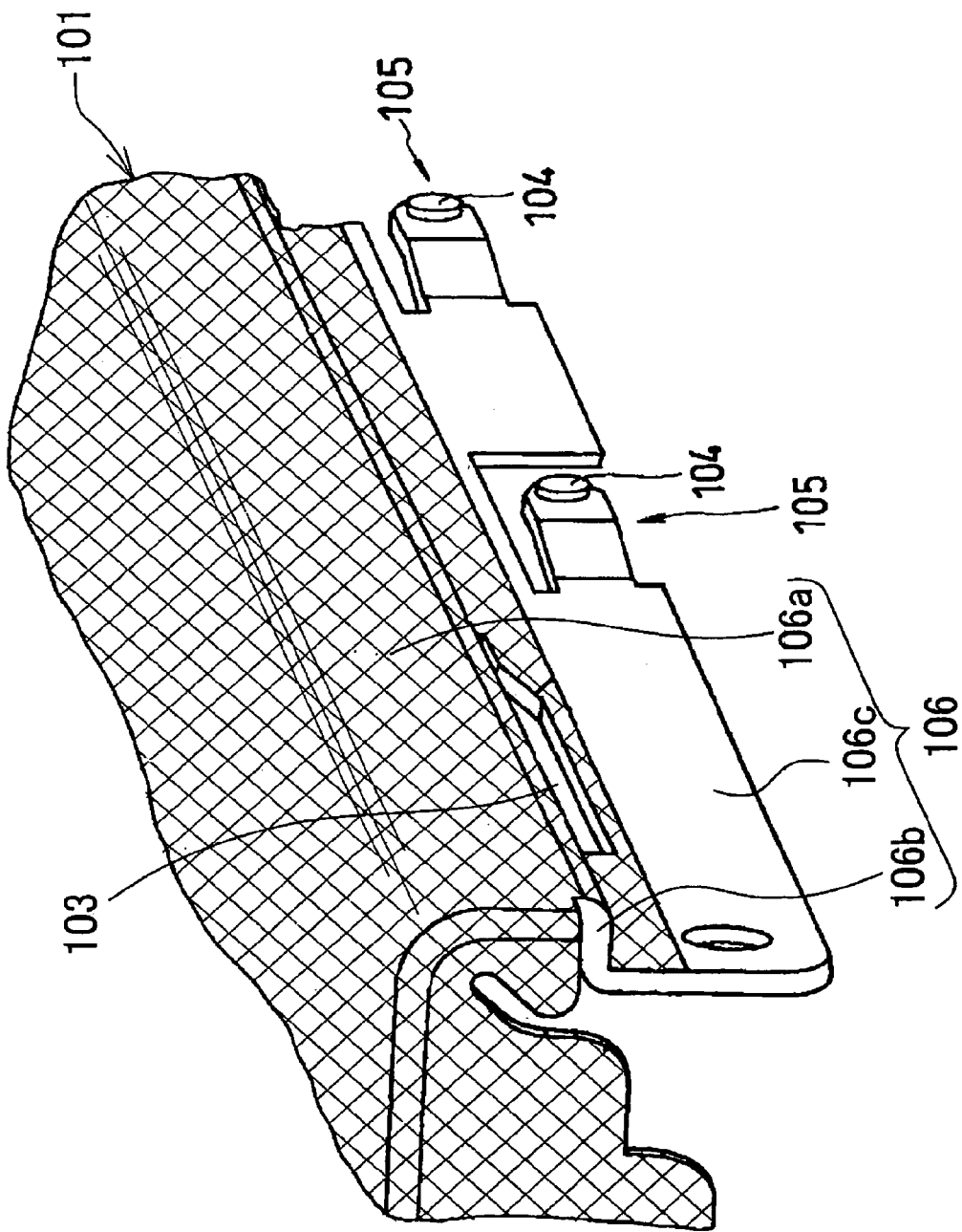
FIG. 5 is a perspective view showing an end portion of the top plate shown in FIG. 3.
Figure 6:
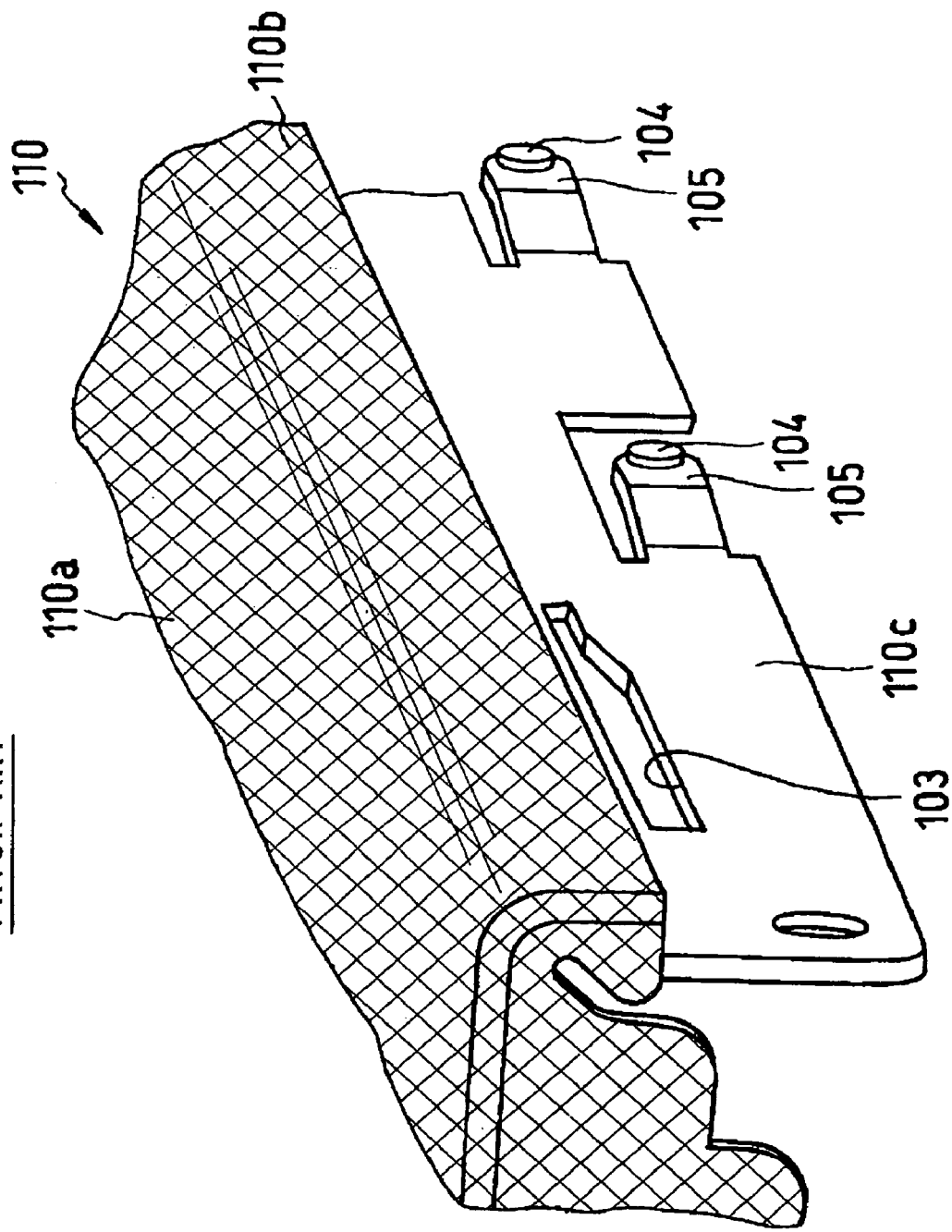
FIG. 6 is a perspective view showing an end portion of a top plate of another conventional housing.
Figure 7:
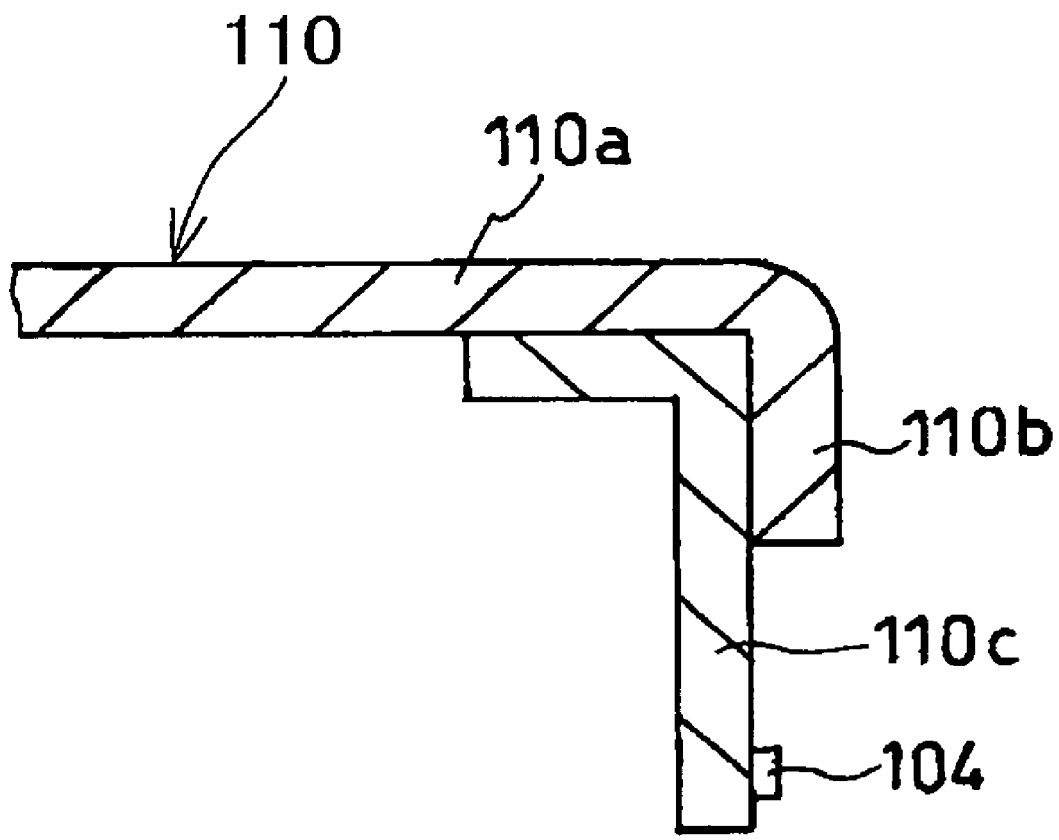
FIG. 7 is a cross sectional view of the top plate of the hosing of FIG. 6.

Referring to FIGS. 1 and 2, there is shown a housing 100 for an electronic apparatus to which the present invention is applied. It is to be noted that, in FIG. 2, colored portions by coating are indicated by intersecting slanting lines.

In the present embodiment, the housing 100 is composed of a top plate 1 (e.g., a first plate or a first metal plate), a bottom plate disposed in parallel to the top plate 1, and a pair of side plates 2 (e.g., a second plate or a second metal plate) disposed on the opposite sides of the top plate 1 and the bottom plate 50. Each of the top plate 1, bottom plate 50 and side plates 2 is formed as a metal plate having a face coated over the entire area thereof and forming an outer face of the housing.

A coupling edge portion 10 for coupling to a coupling edge portion 2b of one of the side plates 2 is formed integrally on a side edge of the top plate 1. The coupling edge portion 10 includes a first portion 10a formed in an L-shape on the side edge of the top plate 1, a second portion 10b bent in an L-shape toward the inner side of the housing from the first portion 10a, and a third portion 10c bent in an L-shape from the second portion 10b such that it extends in parallel to the first portion 10a. A plurality of horizontally elongated projections are provided on the third portion 10c and bent back in a U-shape to form a plurality of vertical contact portions whose non-coated faces are exposed to the outside.

Each of the contact portions 5 whose non-coated faces are exposed to the outside includes a base portion 5a connecting to the third portion 10c, an intermediate portion 5b or a pair of intermediate portions 5b extending obliquely outwardly from one side or the opposite sides of the base portion 5a, and an end portion 5c or a pair of end portions 5c extending from the intermediate portion 5b or intermediate portions 5b. A projection 4 is provided integrally at a central portion of an outer face of the end portion 5c or each of the end portions 5c and projects toward the outside.

A plurality of horizontally elongated fitting slots 3 are formed at different locations of an upper portion of the third portion 10c of the coupling edge portion 10 such that each of them tapers toward one end thereof.

A coupling edge portion 2b is formed on and bent in an L-shape from an upper side edge of the side plate 2, and a plurality of fitting pawls 2a are formed in a projecting manner at different locations of the coupling edge portion 2b. While the outer face of the side plate 2 is colored by coating including the outer face of the coupling edge portion 2b, the inner face of the side plate 2 is not coated including the inner face of the coupling edge portion 2b.

The top plate 1 and the side plate 2 are coupled to each other in the following manner. The fitting pawls 2a of the side plate 2 are inserted into the fitting slots 3 of the top plate 1 and slidably moved in the fitting slots 3 of the side plate 2 toward the tapering end side of them as indicated by an arrow mark in FIG. 1 to fit the fitting pawls 2a into the fitting slots 3 thereby to couple the coupling edge portion 10 of the top plate 1 and the coupling edge portion 2b of the side plates 2 to each other. In this instance, since the projections 4 of the contact portions 5 project toward the outside farther than the base portion 5a, they are brought into contact with the inner face of the side plate 2. Since the non-coated faces of the contact portions 5 are exposed to the outside and the inner faces of the side plates 2 are not coated, electric connection between the top plate 1 and the side plate 2 is secured.

It is to be noted that a similar coupling edge portion is provided on the opposite side edge of the top plate 1 to that described above, and the side plate on the opposite side to the side plate 2 shown in FIGS. 1 and 2 is coupled in a similar manner as described above to the side plate 2. Also the bottom plate and the side plates are coupled to each other in a similar manner.

Accordingly, the entire housing can intercept radiation of electromagnetic waves generated by an electronic apparatus accommodated therein to the outside of the housing.

It is to be noted that, in order to produce the top plate 1 of the housing of the present embodiment, only it is necessary to shape, for example, a coated steel plate whose outer face is coated over an overall area thereof by bending or stamping. In particular, since the portions of the contact portions 5 which are exposed to the outside are the inner side face of the coated steel plate, it is not necessary to perform coating with the contact portions 5 masked after bending or stamping, and also it is not necessary to produce separate members to be used as the contact portions 5 separately from the metal plate of the base member and join the members to the metal plate. Accordingly, the number of steps and the cost required for the housing of the present embodiment are reduced when compared with those of a conventional housing which requires such steps as just described.

While a preferred embodiment of the present invention has been described using specific terms, such description is for illustrative purposes only, and it is to be understood that changes and variations may be made without departing from the spirit or scope of the following claims.

What is claimed is:

1. A housing for an electronic apparatus, comprising:
a plurality of metal plates including a first metal plate and a second metal plate and each having a coated face coated over an overall area thereof and a non-coated face, said metal plates being assembled to form said housing such that the coated faces thereof are exposed as outer faces to the outside of said housing,
said first metal plate being bent back at a portion thereof such that the non-coated face of said first metal plate is exposed to the outside to form a contact portion on a side edge of said first metal plate,
said first metal plate being coupled to said second metal plate such that the non-coated face of said first plate of said contact portion of said first metal plate is held in contact with a non-coated face of said second metal plate, thereby to establish an electric connection between said first and second metal plates.

2. A housing for an electronic apparatus as claimed in claim 1, wherein a projection for contacting the non-coated face of said second metal plate is provided on the non-coated face of said contact portion of said first metal plate.

3. A housing for an electronic apparatus as claimed in claim 1, wherein an additional contact portion or portions similar to said contact portion are provided on the side edge of said first metal plate so as to contact the non-coated face of said first plate with the non-coated face of said second metal plate.

4. A housing for an electronic apparatus as claimed in claim 3, wherein a projection for contacting the non-coated face of said second metal plate is provided also on the non-coated face of said additional contact portion or portions of said first metal plate.

5. A housing for an electronic apparatus as claimed in claim 1, wherein a coupling edge portion is formed on the side edge of said first metal plate and bent so that the coated face of said first metal plate is directed to the outside, and includes a projection formed thereon so as to be bent back in a U-shape to form the contact portion whose non-coated face is exposed to the outside.

6. A housing for an electronic apparatus as claimed in claim 5, wherein a slot is formed in the coupling edge portion of said first metal plate and a pawl for fitting with said slot is formed on a side edge of said second metal plate.

7. A housing for an electronic apparatus as claimed in claim 5, wherein said coupling edge portion of said first metal plate includes:
a first portion bent in an L-shape on the side edge of said first metal plate;
a second portion bent in an L-shape toward the inner side of said housing from said first portion; and
a third portion bent in an L-shape from said second portion so as to extend in parallel to said first portion, and
wherein the projection on said third portion is bent back in a U-shape to form the contact portion whose non-coated face is exposed to the outside.

8. A housing for an electronic apparatus as claimed in claim 7, wherein a slot is formed in said third portion of said coupling edge portion of said first metal plate and a pawl for fitting with said slot is formed on a side edge of said second metal plate.

9. A housing for an electronic apparatus as claimed in claim 7, wherein said first and second metal plates comprise coated steel plates.

10. A housing for an electronic apparatus as claimed in claim 1, wherein said first and second metal plates form two walls of said housing which extend perpendicularly to each other.

11. The housing of claim 1, wherein said first metal plate being bent back at said portion thereof to form said contact portion comprises a portion of said first metal plate being bent back in a U-shape, such that a portion of the non-coated face of the first metal plate is exposed as an outer face to the outside of the housing, to form said contact portion.

12. The housing of claim 1, wherein said first metal plate being bent back at said portion thereof to form said contact portion, comprises:
   a folded portion of said first metal plate including a portion of the non-coated face of the first metal plate being exposed as an outer face to the outside of the housing to thereby form said contact portion.

13. The housing of claim 1, wherein said contact portion comprises:
   a non-coated face of said contact portion facing the outside of the housing for contacting said non-coated face of said second metal plate; and
   a coated face of said contact portion which is opposed to another portion of said coated face of said first metal plate.

14. The housing of claim 1, wherein said contact portion comprises:
   a non-coated face of said contact portion facing the outside of the housing for contacting said non-coated face of said second metal plate; and
   a coated face of said contact portion which is adjacent to, and substantially parallel to, another portion of said coated face of said first metal plate.

15. The housing of claim 1, wherein said contact portion comprises:
   a non-coated face of said contact portion facing the outside of the housing for contacting said non-coated face of said second metal plate; and
   a coated face of said contact portion which faces another portion of said coated face of said first metal plate.

16. The housing of claim 1, wherein said contact portion comprises:
   a non-coated face of said contact portion facing the outside of the housing; and
   a coated face of said contact portion facing another portion of said coated face of said first metal plate and substantially parallel to said another portion of said coated face of said first metal plate.

17. A housing for an electronic apparatus, comprising:
   a plurality of plates including a first plate and a second plate and each having a coated face coated over an area thereof and a non-coated face, said plates being assembled to form said housing such that the coated faces thereof are exposed as outer faces to the outside of said housing,
   said first plate being bent back at a portion thereof such that the non-coated face of said first plate is exposed to the outside to form a contact portion on a side edge of said first plate.

18. The housing of claim 17, wherein said first plate is coupled to said second plate such that the non-coated face of said contact portion of said first plate is held in contact with the non-coated face of said second plate, thereby to establish an electric connection between said first and second plates.

19. The housing of claim 18, wherein said first and second plates comprise metal plates.

20. The housing of claim 19, wherein a projection for contacting the non-coated face of said second metal plate is provided on the non-coated face of said contact portion of said first metal plate.

21. The housing of claim 19, wherein an additional contact portion or portions similar to said contact portion are provided on the side edge of said first metal plate so as to contact at the non-coated face of said first plate thereof with the non-coated face of said second metal plate.

22. The housing of claim 21, wherein a projection for contacting the non-coated face of said second metal plate is provided also on the non-coated face of said additional contact portion or portions of said first metal plate.

23. The housing of claim 18, wherein a coupling edge portion is formed on the side edge of said first plate and bent so that the coated face of said first plate is directed to the outside, and includes a projection formed thereon so as to be bent back in a U-shape to form the contact portion whose non-coated face is exposed to the outside.

24. The housing of claim 23, wherein a slot is formed in the coupling edge portion of said first plate and a pawl for fitting with said slot is formed on a side edge of said second plate.

25. The housing of claim 23, wherein said coupling edge portion of said first metal plate includes:
   a first portion bent in an L-shape on the side edge of said first plate;
   a second portion bent in an L-shape toward the inner side of said housing from said first portion; and
   a third portion bent in an L-shape from said second portion so as to extend in parallel to said first portion, and
   wherein the projection on said third portion is bent back in a U-shape to form the contact portion whose non-coated face is exposed to the outside.

26. The housing of claim 25, wherein a slot is formed in said third portion of said coupling edge portion of said first plate while a pawl for fitting with said slot is formed on a side edge of said second plate.

27. The housing of claim 17, wherein said first metal plate being bent back at said portion thereof to form said contact portion comprises a portion of said first metal plate being bent back in a U-shape, such that a portion of the non-coated face of the first metal plate is exposed as an outer face to the outside of the housing, to form said contact portion.

28. The housing of claim 17, wherein said first metal plate being bent back at said portion thereof to form said contact portion, comprises:
   a folded portion of said first metal plate including a portion of the non-coated face of the first metal plate being exposed as an outer face to the outside of the housing to thereby form said contact portion.

29. The housing of claim 17, wherein said contact portion comprises:
   a non-coated face of said contact portion facing the outside of the housing for contacting said non-coated face of said second metal plate; and
   a coated face of said contact portion which is opposed to another portion of said coated face of said first metal plate.

30. The housing of claim 17, wherein said contact portion comprises:
   a non-coated face of said contact portion facing the outside of the housing for contacting said non-coated face of said second metal plate; and
   a coated face of said contact portion which is adjacent to, and substantially parallel to, another portion of said coated face of said first metal plate.

31. The housing of claim 17, wherein said contact portion comprises:
   a non-coated face of said contact portion facing the outside of the housing for contacting said non-coated face of said second metal plate; and
   a coated face of said contact portion which faces another portion of said coated face of said first metal plate.

32. The housing of claim 17, wherein said contact portion comprises:

a non-coated face of said contact portion facing the outside of the housing; and a coated face of said contact portion facing another portion of said coated face of said first metal plate and substantially parallel to said another portion of said coated face of said first metal plate.

33. A method of forming an assembled housing for an electronic apparatus, comprising:

coating an overall area of an outer face a plurality of metal plates including a first metal plate and a second metal plate, such that said plurality of metal plates each include a coated exterior face to be faced to the outside of the assembled housing and a non-coated interior face to be faced to the inside of the assembled housing;

bending back a portion of said first metal plate such that a portion of said interior non-coated face of said first metal plate is exposed to the outside to form a contact portion on a side edge of said first metal plate; and coupling said first metal plate to said second metal plate such that said non-coated face of said contact portion of said first metal plate which is bent back is held in contact with the interior non-coated face of said second metal plate, thereby to establish an electric connection between said first metal plate and said second metal plate.

34. A housing for an electronic apparatus, comprising:

a plurality of metal plates comprising a first metal plate and a second metal plate, wherein each of said first metal plate and said second metal plate includes:

an exterior coated face, which faces to an outside of said housing; and an interior non-coated face, which faces to an inside of said housing, wherein said metal plates are coupled together to form said housing such that the exterior coated faces of said first metal plate and said second metal plate are exposed as outer faces to the outside of said housing, wherein said first metal plate comprises a folded portion such that a portion of said interior non-coated face of said first metal plate is exposed to the outside to form a non-coated contact portion on a side edge of said first metal plate, wherein a portion of said second metal plate overlaps said folded portion of said first metal plate, and wherein said non-coated contact portion of said folded portion contacts the interior non-coated face of said second metal plate to electrically connect said first metal plate to said second metal plate.

* * * * *